United States Patent
Briggs et al.

(10) Patent No.: US 10,746,782 B2
(45) Date of Patent: *Aug. 18, 2020

(54) ACCELERATED WAFER TESTING USING NON-DESTRUCTIVE AND LOCALIZED STRESS

(71) Applicant: International Business Machines Corporation, Armonk, NY (US)

(72) Inventors: Benjamin D. Briggs, Waterford, NY (US); Lawrence A. Clevenger, LaGrangeville, NY (US); Nicholas A. Lanzillo, Troy, NY (US); Michael Rizzolo, Albany, NY (US); Theodorus E. Standaert, Clifton Park, NY (US); James H. Stathis, Poughquag, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/803,969

(22) Filed: Nov. 6, 2017

(65) Prior Publication Data
US 2018/0328979 A1 Nov. 15, 2018

Related U.S. Application Data

(63) Continuation of application No. 15/591,226, filed on May 10, 2017.

(51) Int. Cl.
*G01R 31/26* (2020.01)
*G01R 31/28* (2006.01)

(52) U.S. Cl.
CPC ..... *G01R 31/2642* (2013.01); *G01R 31/2875* (2013.01)

(58) Field of Classification Search
CPC ........... G01R 31/2642; G01R 31/2875; G01R 31/2879; G01R 31/2886; G01R 1/0458; H05B 1/0272; H05B 3/34; H05B 3/145
See application file for complete search history.

(56) References Cited

U.S. PATENT DOCUMENTS 5,568,054 A * 10/1996 Iino .................... G01R 31/2868
324/750.05
5,751,015 A 5/1998 Corbett et al.
(Continued)

OTHER PUBLICATIONS

Briggs et al., "Accelerated Wafer Testing Using Non-Desructive and Localized Stress," U.S. Appl. No. 15/591,226, filed May 10, 2017.
(Continued)

*Primary Examiner* — Christopher P McAndrew
*Assistant Examiner* — Zannatul Ferdous
(74) *Attorney, Agent, or Firm* — Cantor Colburn LLP; Vazken Alexanian (57) ABSTRACT

Embodiments of the invention are directed to a semiconductor wafer test system. A non-limiting example of the test system includes a controller, a sensing system communicatively coupled to the controller, and a stress source communicatively coupled to the controller. The controller is configured to control the stress source to deliver an applied stress to a targeted stress area of a semiconductor wafer. The sensing system is configured to detect the applied stress and provide data of the applied stress to the controller. The controller is further configured to control the stress source based at least in part on the data of the applied stress.

16 Claims, 5 Drawing Sheets

(56) References Cited

U.S. PATENT DOCUMENTS

| | | | |
|---|---|---|---|
| 5,936,260 A | 8/1999 | Corbett et al. | |
| 6,104,203 A * | 8/2000 | Costello | G01R 31/2849 165/11.1 |
| 6,157,046 A | 12/2000 | Corbett et al. | |
| 6,320,201 B1 | 11/2001 | Corbett et al. | |
| 6,538,264 B2 | 3/2003 | Corbett et al. | |
| 6,593,156 B2 | 7/2003 | Nikawa | |
| 6,770,906 B2 | 8/2004 | Corbett et al. | |
| 6,815,813 B1 * | 11/2004 | Dalton | H01L 23/3677 257/706 |
| 7,955,955 B2 | 6/2011 | Lane et al. | |
| 8,664,968 B2 | 3/2014 | Baldwin et al. | |
| 8,766,137 B2 | 7/2014 | Nomaru | |
| 9,165,832 B1 * | 10/2015 | Papanu | H01L 21/78 |
| 9,177,887 B2 | 11/2015 | Choi et al. | |
| 9,335,759 B2 | 5/2016 | Breil et al. | |
| 2002/0039800 A1 * | 4/2002 | Yamamoto | G11C 29/006 438/14 |
| 2004/0077200 A1 * | 4/2004 | Ishikawa | G01R 31/01 439/190 |
| 2005/0066739 A1 * | 3/2005 | Gotkis | B24B 37/015 73/760 |
| 2005/0146343 A1 * | 7/2005 | Wright | G01R 31/2875 324/750.05 |
| 2006/0079070 A1 * | 4/2006 | Letertre | B81C 1/00365 438/458 |
| 2009/0060703 A1 * | 3/2009 | Beffa | B07C 5/3412 414/806 |
| 2009/0289353 A1 * | 11/2009 | Chrysler | H01L 23/04 257/712 |
| 2012/0211748 A1 * | 8/2012 | Miccoli | B23K 26/032 257/52 |
| 2013/0087904 A1 * | 4/2013 | Clark | H01L 23/13 257/706 |
| 2013/0329221 A1 * | 12/2013 | Sopori | G01N 25/72 356/237.5 |
| 2015/0276681 A1 * | 10/2015 | Nguyen | G01N 29/28 73/618 |
| 2015/0340267 A1 * | 11/2015 | Parker | H01L 21/763 257/506 |
| 2016/0172266 A1 * | 6/2016 | Kadoguchi | H01L 23/3107 257/717 |

OTHER PUBLICATIONS

List of IBM Patents or Patent Applications Treated as Related; Date Filed: Nov. 6, 2017, 2 pages.

* cited by examiner

ACCELERATED WAFER TESTING USING NON-DESTRUCTIVE AND LOCALIZED STRESS

DOMESTIC PRIORITY

This application is a continuation of U.S. application Ser. No. 15/591,226, filed May 10, 2017, the contents of which are incorporated by reference herein in its entirety.

BACKGROUND

The present invention relates in general to the fabrication and testing of semiconductor wafers. More specifically, the present invention relates to systems, methods and computer program products for performing accelerated semiconductor wafer testing by applying non-destructive, controlled and localized stress to the wafer under test.

In electronics, the term "reliability" is used to describe the probability that a component operating under specified conditions will perform satisfactorily for a given period of time. Scaling semiconductor circuitry to increasingly smaller dimensions impacts the lifetime and reliability of individual devices due to increased fragility, higher power density, more complex devices, and new failure mechanisms. Semiconductor test systems and methodologies have been developed to test the affect on product reliability of a variety of wear-out mechanisms, including, for example, electromigration (EM), gate oxide integrity (GOI), negative bias temperature instability (NBTI), stress migration (SM), and the like.

So-called "accelerated testing" identifies wear-out mechanisms under specific stress conditions, including, for example, increased temperature. Accelerated testing compresses time. For example, performing 100 hours of testing under accelerated stress conditions (e.g., at high temperatures) can be equivalent to 10,000 hours of operation under use conditions.

SUMMARY

Embodiments of the invention are directed to a semiconductor wafer test system. A non-limiting example of the test system includes a controller, a sensing system communicatively coupled to the controller, and a stress source communicatively coupled to the controller. The controller is configured to control the stress source to deliver an applied stress to a targeted stress area of a semiconductor wafer. The sensing system is configured to detect the applied stress and provide data of the applied stress to the controller. The controller is further configured to control the stress source based at least in part on the data of the applied stress.

Embodiments of the invention are directed to a computer-implemented method of testing a semiconductor wafer. A non-limiting example of the computer-implemented method includes controlling, using a controller, a stress source to deliver an applied stress to a targeted stress area of the semiconductor wafer. Data of the applied stress is collected and provided to the controller using a sensing system. Based at least in part on the data of the applied stress, the controller controls the stress source to adjust the applied stress.

Embodiments of the invention are directed to a computer program product that includes a computer readable storage medium having program instructions embodied therewith. The program instructions are executable by a processor to cause the processor to perform operations. A non-limiting example of the operations includes controlling a stress source to deliver an applied stress to a targeted stress area of a semiconductor wafer. The operations further include sensing and/or developing data of the applied stress. The operations further include controlling the stress source based at least in part on the data of the applied stress.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

In the accompanying figures and following detailed description of the disclosed embodiments, the various elements illustrated in the figures are provided with three or four digit reference numbers.

DETAILED DESCRIPTION

Various embodiments of the present invention will now be described with reference to the related drawings. Alternative embodiments of the invention can be devised without departing from the scope of this invention. Various connections and relationships are set forth between elements in the following description and in the drawings. These connections and relationships, unless specified otherwise, can be direct or indirect, and the present invention is not intended to be limiting in this respect. Accordingly, a coupling of entities can refer to either a direct or an indirect connection. Additionally, an operation that is performed subsequently with respect to a preceding operation may or may not involve one or more intermediate operations between the preceding operation and the subsequent operation.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, integrated circuits (ICs) are formed from semiconductor devices configured to form circuits on a semiconductor wafer. Alternatively, semiconductor devices can be formed as monolithic devices, e.g., discrete devices. Semiconductor devices are formed on semiconductor wafers by depositing many types of thin films of material over the semiconductor wafer, patterning the thin films of material, doping selective regions of the semiconductor wafer, etc.

CMOS (complementary metal-oxide semiconductor) is a semiconductor fabrication technology used in the transistors that are manufactured into most of today's computer microchips. In CMOS technology, both n-type and p-type transistors are used in a complementary way to form a current gate that forms an effective means of electrical control. Processing steps performed later in CMOS technology fabrication sequences are known as back-end-of-line (BEOL) CMOS processing, and processing steps performed earlier in CMOS technology fabrication sequences are known as front-end-of-line (FEOL) CMOS processing. FEOL manufacturing involves the formation of a plurality of die on the surface of a semiconductor wafer. Each semiconductor die is typically identical and contains circuits formed by electrically connecting active and passive components. BEOL manufacturing involves singulating individual semiconductor die from the finished wafer and packaging the die to provide structural support and environmental isolation. The phrase "semiconductor die" as used herein refers to both the singular and plural forms of the word, and accordingly can refer to both a single semiconductor device and multiple semiconductor devices.

In a conventional semiconductor fabrication process, a large number of ICs are fabricated as a so-called "chip" of the wafer. After completion of device level and interconnect level fabrication processes, the semiconductor chips on the wafer can be separated, and the final product is ready for packaging.

It is desirable to test the performance of IC products at the wafer-level before dicing and packaging in order to acquire statistical yield and performance data and package only known-good dies. Wafer testing is performed before a wafer is sent to die preparation. In wafer testing, all individual ICs or chips that are present on the wafer are tested for functional defects by applying special test patterns to them. The contents of all test patterns and the sequence by which they are applied to an IC are called the test program. Wafer testing can be performed by a piece of test equipment known as a wafer prober. For electrical testing, a set of microscopic contacts or probes are held in place while the wafer, which is vacuum-mounted on a wafer chuck, is moved into electrical contact with the probe card of the wafer prober. When a chip on the wafer has been electrically tested, the prober moves the wafer to position another chip under the probe card so the next test can start. The wafer prober can load and unload the wafers from a carrier (or cassette), and automatic pattern recognition optics can align the wafer with sufficient accuracy to ensure accurate registration (physical or wireless) between the wafer contact pads and the tips of the probe cards. When all test patterns pass for a specific chip, its position is remembered for later use during IC packaging. If a chip does not pass enough test patterns, the chip is considered faulty and will be discarded. Non-passing chips are typically marked so they can be identified and discarded after the wafer is cut.

As previously noted herein, scaling semiconductor circuitry into increasingly smaller dimensions impacts the lifetime and reliability of individual devices due to increased fragility, higher power density, more complex devices, and new failure mechanisms. Wafer testing protocols have been developed to test the effects on product reliability of a variety of wear-out mechanisms, including, for example, electromigration (EM), gate oxide integrity (GOI), negative bias temperature instability (NBTI), stress migration (SM), and the like. So-called "accelerated testing" identifies wear-out mechanisms under specific stress conditions, including, for example, increased temperature. Accelerated testing compresses time. For example, performing 100 hours of testing under accelerated stress conditions (e.g., at high temperatures) can be equivalent to 10,000 hours of operation under use conditions.

Current midstream reliability testing relies on Joule heating (a.k.a., a "sweat test"), which is performed by driving exceptionally large current densities through the reliability structures on the wafer. Joule heating describes the process by which the energy of an electric current is converted into heat as it flows through a resistance. In particular, when the electric current flows through a solid or a liquid with finite conductivity, electric energy is converted to heat through resistive losses in the material. The heat is generated on the micro-scale when the conduction electrons transfer energy to the conductor's atoms by way of collisions.

Although Joule heating can under certain circumstances be a relatively rapid test, Joule heating does not provide details on kinetics and the causes of rapid failures. Additionally, there are unwanted effects from using Joule heating to provide the high temperature stress required for certain accelerated reliability testing regimens. Joule heating increases most in regions of the wafer that have small cross-sectional areas, which can make via quality appear to be artificially poor. Joule heating spreads throughout the wafer and is not limited to the targeted reliability structures. The heating of non-reliability structures (e.g., product structures such as the logic and memory of the functional IC) can cause them to degenerate, malfunction, or even melt. As a result, midstream wafer testing that relies on Joule heating is destructive in that the Joule heating renders the wafer inoperable and no subsequent use can be made of the wafer after a destructive wafer test has been performed.

Turning now to an overview of aspects of the present invention, one or more embodiments of the invention provide testing systems, methodologies and computer program products that locally apply stress to targeted stress areas (e.g., a reliability macro or other test site) on a semiconductor wafer without significantly spreading the stress to portions of the wafer that are outside the targeted stress area. In some embodiments of the invention, a controller is communicatively coupled to a stress source and a sensing system. The controller and the stress source are configured to deliver an applied stress level to a targeted stress area of a semiconductor wafer under test. The stress level applied to the wafer can be precisely controlled using a feedback configuration in which the sensing system senses the stress level applied to the targeted stress area. The sensing system provides data of the applied stress level to the controller, which uses the data of the applied stress to precisely control the stress source. Based at least in part on the data of the applied stress, the controller controls the stress source to adjust the applied stress such that the applied stress is maintained outside a level that would damage or destroy reliability structures in the targeted stress area. In some embodiments of the invention, based at least in part on the data of the applied stress, the controller controls the stress source to adjust the applied stress such that the applied stress is maintained at an acceptable level (or within a range of the acceptable level) for conducting the particular test regimen. In some embodiments of the invention, maintaining the applied stress level below a stress level that would damage the reliability structures has priority over maintaining the applied stress at an acceptable level (or within a range of the acceptable level) for conducting the particular test regimen.

In some embodiments of the invention, the applied stress is separate and distinct from the current flow supplied to the reliability structures in the targeted stress area during an accelerated wafer testing regimen. In some embodiments, the stress source is configured to provide an applied stress having a duty cycle. In other words, the applied stress alternates between periods when the stress is applied and periods when the stress is not applied. The controller and the stress source can control the applied stress duty cycle to synchronize the applied stress duty cycle with the above-described current flow such that the stress generated during the active portion of the stress duty cycle is allowed to dissipate sufficiently before the subsequent active portion of the stress duty cycle is generated. In some embodiments of the invention, the controller incorporates the above-described data of the applied stress, which is gathered by the sensing system, in controlling the stress duty cycle to synchronize the applied stress duty cycle with the above-described current flow. Accordingly, the stress duty cycle can be dynamically adjusted so that non-targeted stress areas of the wafer are substantially unaffected by the applied stress.

In some embodiments of the invention, the applied stress is substantially prevented from spreading outside the targeted stress area by providing stress sinks (or barriers or pipes) that substantially absorb portions of the applied stress that attempt to migrate to areas of the semiconductor wafer that are outside the targeted stress area. In some embodiments of the invention, the stress sinks are located on selected portions of the semiconductor wafer under test. In some embodiments of the invention, an optional stress-splitting structure splits the applied so that a stress source can heat multiple targeted stress areas (on the same or different wafers) in parallel during electrical probing to increase throughput.

In some embodiments of the invention, a laser-based configuration of the above-described embodiments of the invention can be provided, wherein the stress source is a laser that delivers a laser pulse to the targeted stress area of the wafer; the applied stress is the heat generated by the laser pulse; the targeted stress area is a kerf region of the wafer; and the stress sink is a crack stop of the wafer. Conventionally, test structures and monitoring structures are formed in the kerf regions of the wafer. The crack stops are the dicing lanes and regions in between the product chips of the wafer that reduce or prevent the propagation of cracks when the wafer is cut into individual semiconductor chips. In some embodiments of the invention, the laser-based configuration includes a beam-splitting structure that splits the laser pulse so that a single laser pulse can heat multiple targeted stress areas (on the same or different wafers) in parallel during electrical probing to increase throughput. In some embodiments of the invention, the controller is configured to vary the laser pulse location to simulate hot spot variations. For example, the controller can be configured to selectively heat a via in an EM structure to simulate a power-hungry transistor directly below the interconnect.

Embodiments of the invention address shortcomings of known wafer testing systems and methods by confining the applied stress to targeted wafer stress areas during wafer testing. The applied stress level can be precisely controlled and dynamically changed to prevent the applied stress from damaging the targeted stress areas or the non-targeted stress areas of the wafer, as well as prevent stress (e.g., heat) from transferring to the wafer prober (e.g., the chuck that holds the wafer) that conducts wafer testing. By not heating the entire wafer, testing one wafer does not impact other wafers still in the product stream for customer use. Accordingly, applying stress according to embodiments of the invention is an attractive complement to wafer-level EM testing equipment when stress temperature exceeds the wafer chuck temperature. Separating the source of applied stress from the source of test current flow allows improved prediction of kinetics and observation of early failure progression over known Joule heating stress methods. Testing time can be improved by splitting the applied laser stress to allow parallel testing of multiple targeted stress areas on the same or different wafers. In embodiments of the invention, stress can be applied to the same location were the wafer is being contacted by a probe card of a wafer prober.

Figure 1:
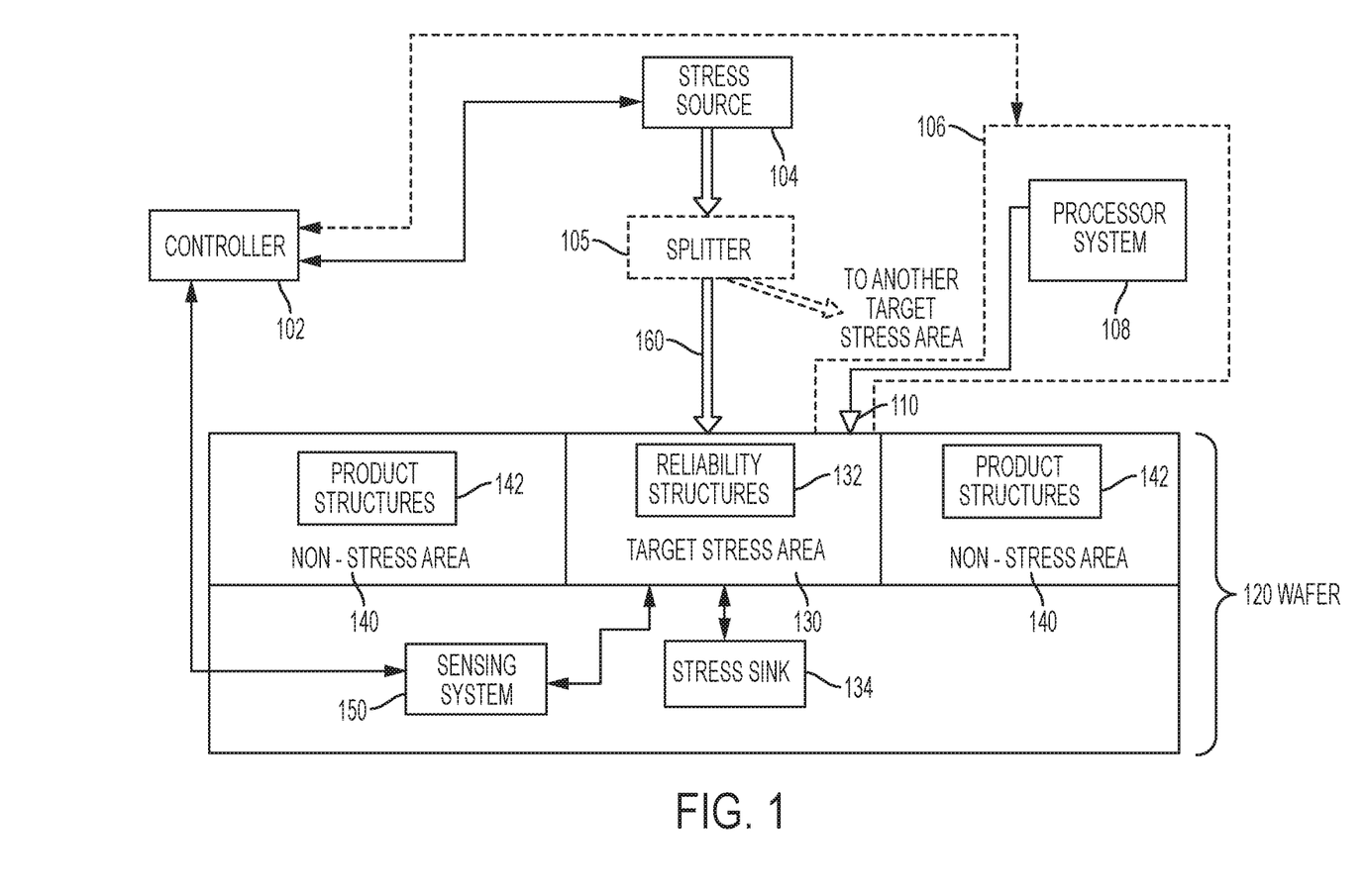
FIG. 1 depicts a block diagram illustrating a semiconductor wafer test system according to embodiments of the invention.

Turning now to a more detailed description of aspects of the present invention, FIG. 1 depicts a block diagram illustrating a semiconductor wafer testing system 100 according to embodiments of the invention. The system 100 includes a controller 102, a stress source 104, an optional stress splitter 105, a sensing system 150, and a stress sink 134, configured and arranged as shown. For ease of illustration, the sensing system 150 and the stress sink 134 are shown as integral components of the wafer 120. However, in some embodiments of the invention, the sensing system 150 and the stress sink 134 can be separate from and coupled to the wafer 120. The system 100 is configured to integrate with a wafer prober 106. For ease of illustration, only the processor system 108 and probe card 110 of the wafer prober 106 are shown in FIG. 1. In practice however, the wafer prober 106 includes all the features and functionality of known wafer prober equipment. The system 100 and the wafer prober 106 interact with a semiconductor wafer 120 having a targeted stress area 130 and non-targeted non-stress areas 140. Reliability structures (e.g., test structures, monitoring structures, and the like) 132 are provided in the targeted stress areas 130, and product structures 142 (e.g., logic and memory of the functional IC, also referred to herein as non-reliability circuitry) are provided in the non-stress areas 140. In some embodiments of the invention, the sensing system 150 and the stress sink 134 can be integrated with the semiconductor wafer 120. In some embodiments of the invention, the controller 102 and the processor system 108 can be integrated into a single component.

An example operation of the system 100 and the wafer prober 106 will now be provided. The wafer prober 106 positions the wafer 120 such that the probe card 110 can register with the stress area 130. In some embodiments of the invention, the probe card 110 registers with the stress area 130 through contacts (not shown). The processor system 108 applies a test pattern to reliability structures 132 in the targeted stress area 130. The processor system 108 provides data about the test pattern to the controller 102, and the controller 102 uses the data about the test pattern to determine, in part, the stress levels that will need to be applied by the stress source 104 to support the test pattern. For example, if the test pattern is an accelerated EM test pattern, the controller 102 can determine that it needs to control the stress source 104 to generate and apply a heat stress to the targeted stress area 130 while the wafer probe 105 applies the test pattern to the targeted stress area 130.

In some embodiments of the invention, the stress level applied to the wafer 120 can be precisely controlled using a feedback configuration in which the sensing system 150 senses the stress level applied to the targeted stress area 130. The sensing system 150 provides data of the applied stress level to the controller 102, which uses the data of the applied stress to precisely control the stress source 104. Based at least in part on the data of the applied stress, the controller 102 controls the stress source 104 to adjust the applied stress 160 such that the applied stress 160 is maintained outside a level that would damage or destroy the reliability structures 132 in the targeted stress area 130. In some embodiments of the invention, based at least in part on the data of the applied stress, the controller 102 controls the stress source 104 to adjust the applied stress 160 such that the applied stress 160 is maintained at an acceptable level (or within a range of the acceptable level) for conducting the particular test regimen. In some embodiments of the invention, maintaining the applied stress level below a stress level that would damage or destroy the reliability structures 132 has priority over maintaining the applied stress at an acceptable level (or within a range of the acceptable level) for conducting the particular test regimen.

In some embodiments of the invention, the applied stress 160 is separate and distinct from the current flow supplied to the reliability structures 132 in the targeted stress area 130 during an accelerated wafer testing regimen. In some embodiments of the invention, the stress source 104 is configured to, under control of the controller 102, provide the applied stress 160 with a duty cycle. In other words, the applied stress 160 can alternate between periods when the stress is applied and periods when the stress is not applied. The controller 102 and the stress source 104 can control the applied stress duty cycle to synchronize the applied stress duty cycle with the test pattern current flow such that the stress generated during the active portion of the stress duty cycle is allowed to dissipate sufficiently before the subsequent active portion of the applied stress duty cycle is generated. In some embodiments of the invention, the controller 102 incorporates the above-described data of the applied stress, which is gathered by the sensing system 150, in controlling in the applied stress duty cycle to synchronize the applied stress duty cycle with the test pattern current flow. Accordingly, the controller 102, the stress source 104 and the sensing system 150 can dynamically adjust the stress duty cycle so that the non-targeted stress areas 140 (and the product components 142 therein) are substantially unaffected by the applied stress.

In some embodiments of the invention, the applied stress 160 is substantially prevented from spreading outside the targeted stress area 130 by providing stress sinks 134 (or barriers or pipes) that substantially absorb portions of the applied stress that attempt to migrate to areas of the semiconductor wafer 120 outside the targeted stress area 130 and into the non-stress areas 140. In some embodiments of the invention, the stress sinks 134 are located on selected portions of the semiconductor wafer 120. In some embodiments of the invention, the beam-splitting structure 105 of the system 100 can operate to split the output (applied stress 160) of the stress source 104 so that a single output from the stress source 104 can stress multiple targeted stress areas (e.g., stress area 130) on the same or different wafers in parallel during application of the test pattern to increase throughput.

Figure 2:
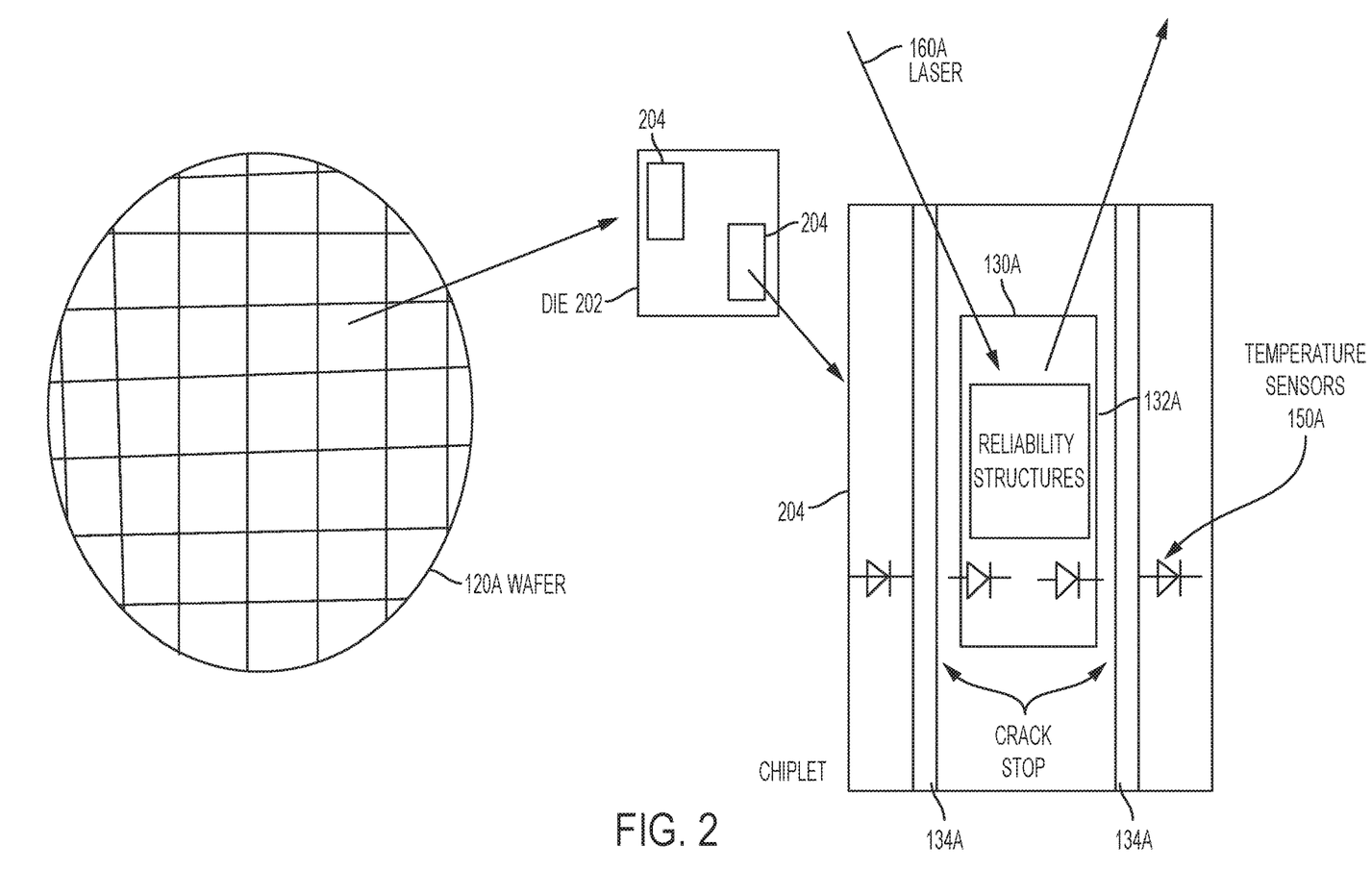
FIG. 2 depicts a diagram illustrating details of semiconductor wafer that can be implemented with a semiconductor test system according to embodiments of the invention.
Figure 3:
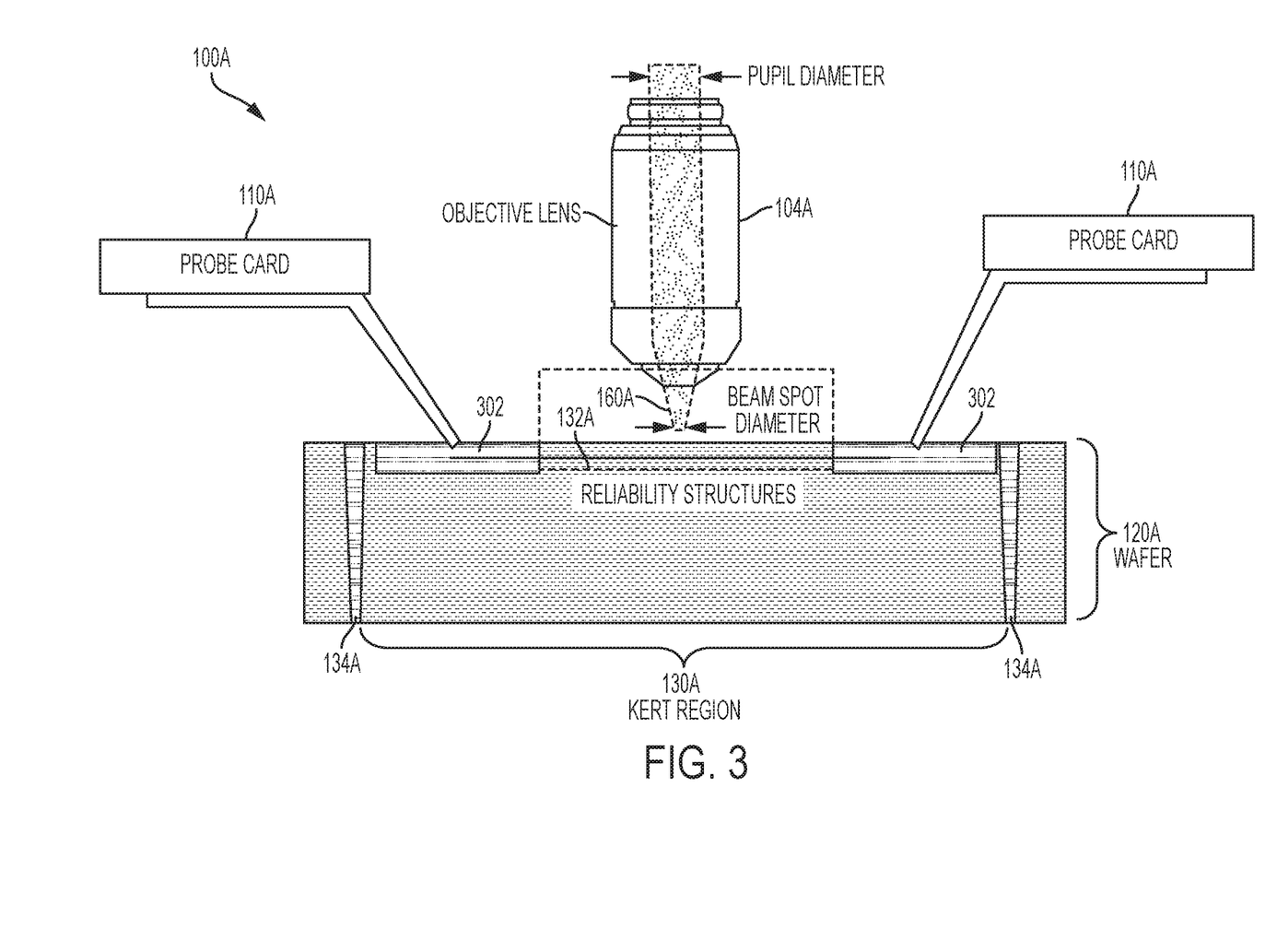
FIG. 3 depicts a diagram illustrating a more specific example of a semiconductor test system according to embodiments of the invention.

FIG. 2 depicts a diagram illustrating a top-down view of a semiconductor wafer 120A that can be tested with a laser-based semiconductor test system 100A, which is shown in FIG. 3, according to embodiments of the invention. FIG. 3 depicts a side and partially cross-sectional view of the laser-based semiconductor test system 100A. The semiconductor wafer 120A is a specific example of the semiconductor wafer 120 (shown in FIG. 1) in that the targeted stress region 130 is implemented as a kerf region 130A; the sensing system 150 is implemented as sensors 150A; and the stress sink 134 is implemented as crack stops 134A. The laser-based test system 100A shown in FIG. 3 is a specific example of the system 100 (shown in FIG. 1) in that the stress source 104 is implemented as a laser 104A that delivers a laser pulse 160A to the kerf region 130A of the wafer 120A; and the applied stress includes the heat generated by the laser stress 160A. Although not depicted in FIGS. 2 and 3, the system 100A utilizes the same controller 102, processor system 108 and optional stress splitter 105 utilized in the system 100. In the laser-based system 100A, the stress splitter 105 can be implemented a beam-splitting structure that splits the laser stress 160A so that a single laser pulse can heat multiple targeted stress areas (on the same or different wafers) in parallel during electrical probing to increase throughput.

As shown in FIG. 2, the wafer 120A includes a plurality of dies 202. Each die 202 includes chiplets 204, and each chiplet 204 includes at least one kerf region 130A, crack stops 134A, and sensors 150A. The sensors 150A can be placed on the left/right side of the crack-stops 134A and in the kerf region 130A so that the output of laser 104 can be adjusted dynamically as described herein. The crack stops 134A are the dicing lanes and regions in the wafer 120A that reduce or prevent the propagation of cracks when the wafer 120A is cut into individual chiplets 204. As shown in FIG. 3, the crack stops 134A can extend through the entire width of the wafer 120A. Returning to FIG. 2, non-stress areas 140A are found in any wafer location outside the kerf region 130A that is currently under test. The kerf region 130A includes reliability structures 132A. In various semiconductor fabrication processes, the semiconductor wafers that are produced have active regions (e.g., non-stress areas 140 shown in FIG. 1). These semiconductor wafers can be separated to produce individual IC chips. Chip separation processes can occur along or in kerf regions (e.g., kerf region 130A) to separate the semiconductor wafer. Kerf regions can be located adjacent to and/or between the active regions. The kerf regions can include auxiliary structures (e.g., reliability structures 132A). In some embodiments of the invention, the term "auxiliary structure" can refer to a structure formed during the processing of a semiconductor wafer that are not necessary for post fabrication functioning of the active structures of the processed semiconductor wafer (e.g., IC chips of the semiconductor wafer), and particularly can refer to structures that can be used to evaluate the fabrication processes of a semiconductor device. Examples of auxiliary structures can include, for example, process control monitor (PCM) devices, lithographic structures, metal pads, contacts for electrochemical etching, alignment structures and the like.

An example operation of the system 100A will now be provided with reference to the semiconductor wafer 120A shown in FIG. 2 and the system 100A shown in FIG. 3. The wafer prober 106 (shown in FIG. 1) positions the wafer 120A such that probe cards 110A can register with contacts 302 in the stress area 130A, and the processor system 108 (shown in FIG. 1) applies a test pattern to reliability structures 132A in the targeted kerf region 130A. The processor 108 provides data about the test pattern to the controller 102 (shown in FIG. 1), and the controller 102 uses the data about the test pattern to determine, in part, the laser stress levels (or power, or duty cycle, or both) that will need to be applied by the laser 104A to support the test pattern. For example, if the test pattern is an accelerated EM test pattern, the controller 102 can determine that it needs to control the laser 104A to generate and apply laser energy to the targeted kerf region 130A while the wafer probe 105A applies the test pattern to the targeted kerf region 130A.

The stress level applied to the wafer 120A can be precisely controlled using a feedback configuration in which the sensors 150A senses the laser stress level applied to the targeted kerf region 130A. The sensors 150A provide data of the applied laser stress level to the controller 102, which uses the data of the applied laser stress to precisely control the laser 104A. Based at least in part on the data of the applied laser stress, the controller 102 controls the laser source 104A to adjust the applied laser stress 160A such that the applied laser stress 160A generates heat that is maintained outside a level that would damage or destroy the reliability structures 132A in the targeted kerf region 130A. In some embodiments of the invention, based at least in part on the data of the applied laser stress, the controller 102 controls the laser 104A to adjust the applied laser stress 160A such that the applied laser stress 160A generates heat that is maintained at an acceptable level (or within a range of the acceptable level) for conducting the particular test regimen. In some embodiments of the invention, maintaining the applied laser stress level below an applied laser stress level that would damage or destroy the reliability structures 132A has priority over maintaining the applied laser stress 160A at an acceptable level (or within a range of the acceptable level) for conducting the particular test regimen.

In some embodiments of the invention, the applied laser stress 160A is separate and distinct from the current flow supplied to the reliability structures 132A in the targeted kerf region 130 during an accelerated wafer testing regimen. In some embodiments, the laser 104A is configured to, under control of the controller 102, provide the applied laser stress 160A with a duty cycle. In other words, the applied laser stress 160A is pulsed and alternates between periods when the laser stress 160A is applied and periods when the laser stress 160A is not applied. The controller 102 and the laser 104A can control the laser stress duty cycle to synchronize the applied laser stress duty cycle with the test pattern current flow such that the stress generated during the active portion of the laser stress duty cycle is allowed to dissipate sufficiently before the subsequent active portion of the laser stress duty cycle is generated. In some embodiments of the invention, the controller 102 incorporates the above-described data of the applied laser stress, which is gathered by the sensors 150A, in controlling in the laser stress duty cycle to synchronize the applied laser stress duty cycle with the test pattern current flow. Accordingly, the controller 102, the laser 104A and the sensors 150A can dynamically adjust the laser stress duty cycle so that the non-stress areas 140A (and the product components 142A therein) are substantially unaffected by the applied laser stress 160A.

In some embodiments of the invention, the heat generated by the applied laser stress 160A is prevented from spreading outside the kerf region 130A by providing heat sinks in the form of crack stops 134A (or barriers or pipes) that substantially absorb portions of the heat generated by the applied laser stress 160A that attempts to migrate to areas of the semiconductor wafer 120A outside the kerf region 130A and into the non-stress areas 140A. In some embodiments of the invention, the laser-based configuration includes an optional beam-splitting structure 105A that splits the laser output of the laser 104A so that a single laser output can stress multiple targeted kerf region 130A on the same or different wafers in parallel during application of the test pattern to increase throughput.

In some embodiments of the invention, the controller 102 is configured to vary the laser pulse location to simulate hot spot variations. For example, the controller 102 can be configured to selectively heat a via (not shown) in an EM structure to simulate a power-hungry transistor (not shown) directly below the via/interconnect.

Figure 4:
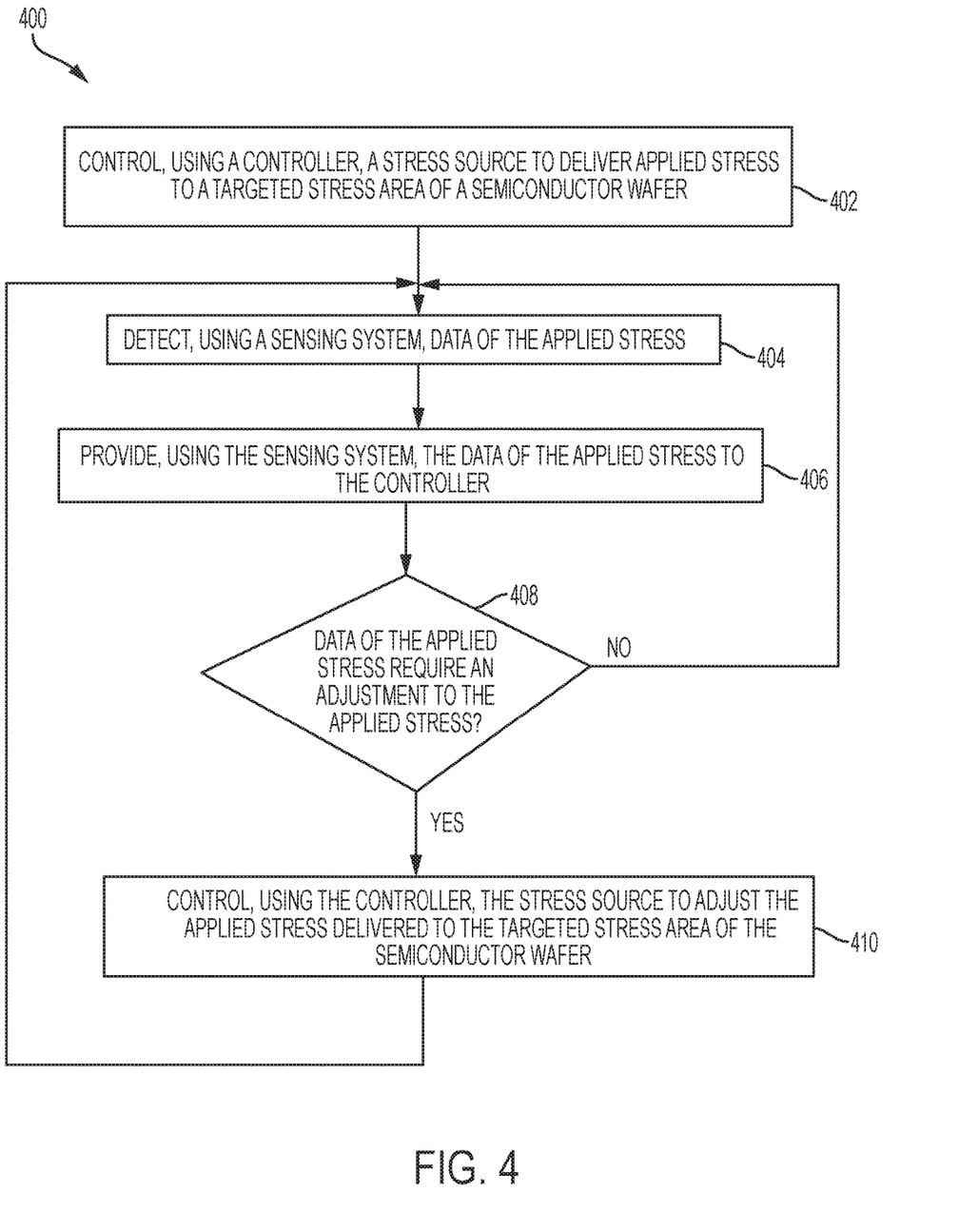
FIG. 4 depicts a flow diagram illustrating a methodology according to embodiments of the invention.

FIG. 4 depicts a flow diagram illustrating a methodology 400 according to embodiments of the invention. The methodology 400 will now be described with reference to the flow diagram of FIG. 4 and the wafer testing system 100 of FIG. 1. The wafer testing system 100 can be used to perform the operations of the methodology 400. At block 402 of the methodology 400, a controller 102 (e.g., controller 102) controls a stress source (e.g., stress source 104 or laser 104A) to deliver applied stress to a targeted stress area (e.g., targeted stress area 130 or the kerf region 130A) of a semiconductor wafer (e.g., wafer 120 or wafer 120A). At block 404, a sensing system (e.g., sensing system 150 or sensors 150A) is used to detect data of the applied stress. At block 406, the sensing system is used to provide the data of the applied stress to the controller. At decision block 408 the controller determines whether the data of the applied stress requires an adjustment to the applied stress. For example, for an accelerated wafer testing regimen in which the applied stress is heat, the controller can be used to adjust the applied heat up or down so that the temperature in the targeted stress area is sufficiently high to satisfy the requirements of the accelerated test regimen. In some embodiments of the invention, the controller can be used to adjust the applied heat up or down so that the temperature in the targeted stress area is sufficiently high to satisfy the requirements of the accelerated test regimen but not so high that reliability structures (e.g., reliability structures 132 or reliability structures 132A) are damaged or destroyed. If the answer to the inquiry at decision block 408 is yes, the methodology 400 moves to block 410 where the controller can be used to control the stress source to adjust the applied stress delivered to the targeted stress area of the semiconductor wafer. From block 410, the methodology 400 returns to block 404. If the answer to the inquiry at decision block 408 is no, the methodology 400 returns to block 404.

Figure 5:
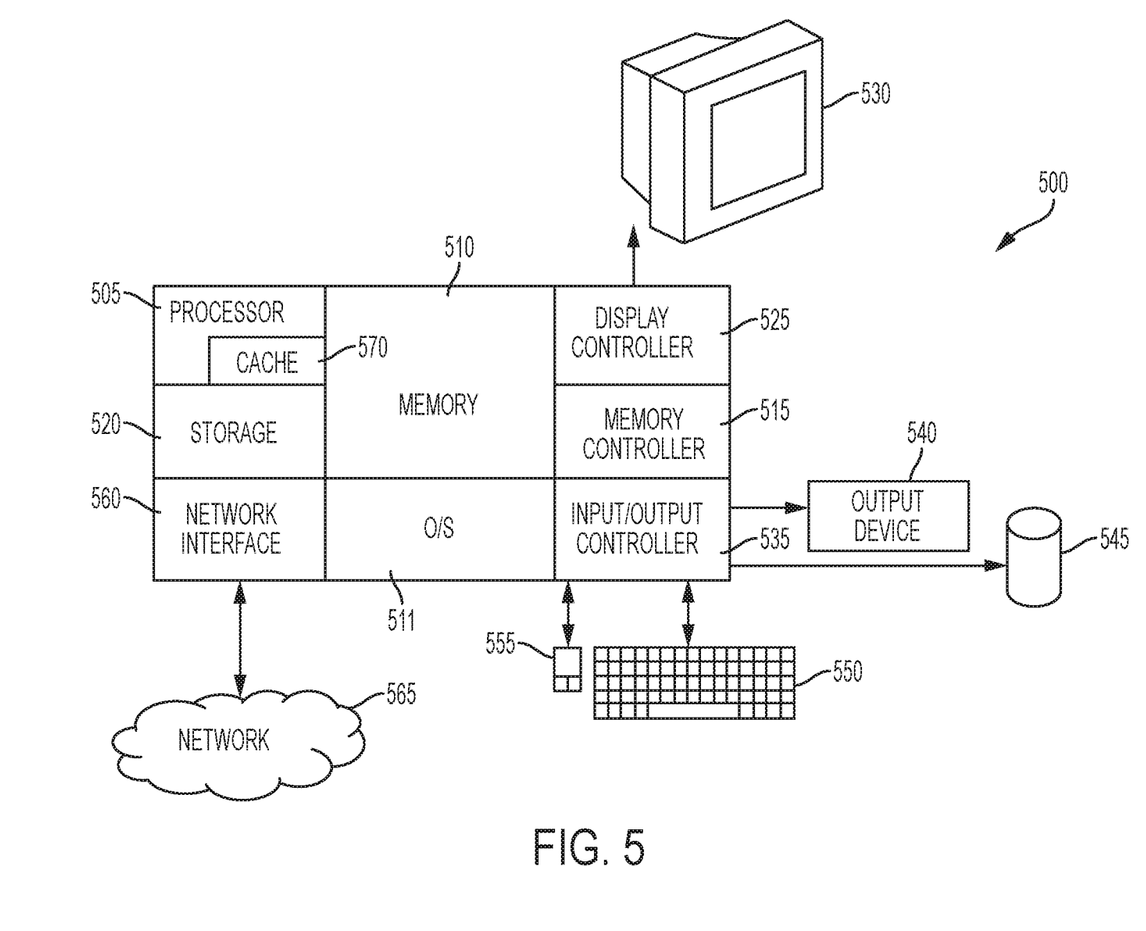
FIG. 5 depicts a computer system capable of implementing embodiments of the invention.

FIG. 5 depicts a computer system 500 capable of implementing one or more aspects of the present invention. Specifically, computer system 500 is capable of implementing at least the controller 102 and/or the processor system 108 shown in FIG. 3. The processing described herein can be implemented in hardware, software (e.g., firmware), or a combination thereof. In an exemplary embodiment, the methods described can be implemented, at least in part, in hardware and can be part of the microprocessor of a special or general-purpose computer system 500, such as a personal computer, workstation, minicomputer or mainframe computer.

In an exemplary embodiment, as shown in FIG. 5, computer system 500 includes a processor 505, memory 510 coupled to a memory controller 515, and one or more input devices 545 and/or output devices 540, such as peripherals, that are communicatively coupled via a local I/O controller 535. These devices 540 and 545 can include, for example, a printer, a scanner, a microphone, and the like. A conventional keyboard 550 and mouse 555 can be coupled to I/O controller 535. I/O controller 535 can be, for example, one or more buses or other wired or wireless connections, as are known in the art. I/O controller 535 can have additional elements, which are omitted for simplicity, such as controllers, buffers (caches), drivers, repeaters, and receivers, to enable communications.

I/O devices 540, 545 can further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

Processor 505 is a hardware device for executing hardware instructions or software, particularly those stored in memory 510. Processor 505 can be a custom made or commercially available processor, a central processing unit (CPU), an auxiliary processor among several processors associated with computer system 500, a semiconductor based microprocessor (in the form of a microchip or chip set), a macroprocessor, or other device for executing instructions. Processor 505 includes a cache 570, which can include, but is not limited to, an instruction cache to speed up executable instruction fetch, a data cache to speed up data fetch and store, and a translation lookaside buffer (TLB) used to speed up virtual-to-physical address translation for both executable instructions and data. Cache 570 can be organized as a hierarchy of more cache levels (L1, L2, etc.).

Memory 510 can include one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, memory 510 can incorporate electronic, magnetic, optical, or other types of storage media. Note that memory 510 can have a distributed architecture, where various components are situated remote from one another but can be accessed by processor 505.

The instructions in memory 510 can include one or more separate programs, each of which comprises an ordered listing of executable instructions for implementing logical functions. In the example of FIG. 5, the instructions in memory 510 include a suitable operating system (OS) 511. The operating system 511 essentially can control the execution of other computer programs and provides scheduling, input-output control, file and data management, memory management, and communication control and related services.

Additional data, including, for example, instructions for processor 505 or other retrievable information, can be stored in storage 520, which can be a storage device such as a hard disk drive or solid state drive. The stored instructions in memory 510 or in storage 520 can include those enabling the processor to execute one or more aspects of the systems and methods of the present invention.

Computer system 500 can further include a display controller 525 coupled to a display 530. In an exemplary embodiment, computer system 500 can further include a network interface 560 for coupling to a network 565. Network 565 can be an IP-based network for communication between the computer system 500 and an external server, client and the like via a broadband connection. Network 565 transmits and receives data between computer system 500 and external systems. In an exemplary embodiment, network 565 can be a managed IP network administered by a service provider. Network 565 can be implemented in a wireless fashion, e.g., using wireless protocols and technologies, such as WiFi, WiMax, etc. Network 565 can also be a packet-switched network such as a local area network, wide area network, metropolitan area network, the Internet, or other similar type of network environment. Network 565 can be a fixed wireless network, a wireless local area network (LAN), a wireless wide area network (WAN) a personal area network (PAN), a virtual private network (VPN), intranet or other suitable network system and can include equipment for receiving and transmitting signals.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" include any integer number greater than or equal to one, i.e. one, two, three, four, etc. The terms "a plurality" include any integer number greater than or equal to two, i.e. two, three, four, five, etc. The term "connection" can include both an indirect "connection" and a direct "connection."

The terms "about," "substantially," "approximately," and variations thereof, include the degree of error associated with measurement of the particular quantity based upon the equipment available at the time of filing the application. For example, "about" can include a range of ±8% or 5%, or 2% of a given value.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method of testing a semiconductor wafer, the computer-implemented method comprising:

controlling, using a controller, a stress source to deliver a localized applied stress to a targeted stress area of a surface of the semiconductor wafer;

further controlling, using the controller, the stress source to, while delivering the localized applied stress to the targeted stress area of the surface of the semiconductor wafer, not deliver the localized applied stress to non-targeted non-stress areas comprising portions of the surface of the semiconductor wafer that are not the targeted stress area;

wherein the targeted stress area and the non-targeted non-stress area include circuitry;

wherein the localized applied stress is not the result of an operation for fabricating the semiconductor wafer;

wherein the targeted stress area is at a fixed and non-random location on the surface of the semiconductor wafer;

wherein the targeted stress area is configured to substantially absorb portions of the localized applied stress that attempt to migrate from the targeted stress area to the non-targeted non-stress area;

detecting, using a sensing system, the localized applied stress;

providing, using the sensing system, localized applied stress data to the controller; and based at least in part on the localized applied stress data, controlling, using the controller, the stress source to adjust the localized applied stress.

2. The computer-implemented method of claim 1 further comprising preventing, using a stress sink, the localized applied stress from substantially extending into the non-targeted non-stress area of the surface of the semiconductor wafer.

3. The computer-implemented method of claim 1, wherein:
the localized applied stress comprises an applied heat; and
the applied heat raises the targeted stress area to a first temperature.

4. The computer-implemented method of claim 3 further comprising preventing, using a heat sink, the migration, into the non-targeted non-stress area, of enough of the applied heat to bring the non-targeted non-stress area to the first temperature.

5. The computer-implemented method of claim 4, wherein:
the circuitry of the targeted stress area comprises reliability circuitry;
the circuitry of the non-targeted non-stress area comprises non-reliability circuitry; and
the first temperature is sufficient to render portions of the non-reliability circuitry substantially inoperable.

6. The computer-implemented method of claim 1, wherein the stress source comprises a laser.

7. The computer-implemented method of claim 1, wherein the targeted stress area comprises a kerf region.

8. The computer-implemented method of claim 2, wherein the stress sink comprises a crack stop.

9. A computer-implemented method of testing a semiconductor wafer, the computer-implemented method comprising:
controlling, using a controller, a stress source to deliver a localized applied stress to a targeted stress area of a surface of the semiconductor wafer;
further controlling, using the controller, the stress source to, while delivering the localized applied stress to the targeted stress area of the surface of the semiconductor wafer, not deliver the localized applied stress to non-targeted non-stress areas comprising portions of the surface of the semiconductor wafer that are not the targeted stress area;
wherein the targeted stress area and the non-targeted non-stress area include circuitry;
wherein the localized applied stress is not the result of an operation for fabricating the semiconductor wafer;
detecting, using a sensing system, the localized applied stress;
providing, using the sensing system, localized applied stress data to the controller; and
based at least in part on the localized applied stress data, controlling, using the controller, the stress source to adjust the localized applied stress.

10. The computer-implemented method of claim 9 further comprising preventing, using a stress sink, the localized applied stress from substantially extending into the non-targeted non-stress area of the semiconductor wafer.

11. The computer-implemented method of claim 9, wherein:
the localized applied stress comprises a localized applied heat; and
the localized applied heat raises the targeted stress area to a first temperature.

12. The computer-implemented method of claim 11 further comprising preventing, using a heat sink, a migration, into the non-targeted non-stress area, of enough of the localized applied heat to bring the non-targeted non-stress area to the first temperature.

13. The computer-implemented method of claim 12, wherein:
the circuitry of the targeted stress area comprises reliability circuitry;
the circuitry of the non-targeted non-stress area comprises non-reliability circuitry; and
the first temperature is sufficient to render portions of the non-reliability circuitry substantially inoperable.

14. The computer-implemented method of claim 9, wherein the stress source comprises a laser.

15. The computer-implemented method of claim 9, wherein the targeted stress area comprises a kerf region.

16. The computer-implemented method of claim 10, wherein the stress sink comprises a crack stop.

* * * * *